United States Patent
Matsunami et al.

(10) Patent No.: US 12,295,265 B2
(45) Date of Patent: May 6, 2025

(54) THERMOELECTRIC MODULE AND METHOD FOR MANUFACTURING THERMOELECTRIC MODULE POST

(71) Applicant: KELK Ltd., Hiratsuka (JP)

(72) Inventors: Hiroyuki Matsunami, Hiratsuka (JP); Tetsushi Tanaka, Fujisawa (JP)

(73) Assignee: KELK Ltd., Hiratsuka (JP)

( * ) Notice: Subject to any disclaimer, the term of this patent is extended or adjusted under 35 U.S.C. 154(b) by 0 days.

(21) Appl. No.: 17/766,777

(22) PCT Filed: Oct. 5, 2020

(86) PCT No.: PCT/JP2020/037686
§ 371 (c)(1),
(2) Date: Apr. 6, 2022

(87) PCT Pub. No.: WO2021/075286
PCT Pub. Date: Apr. 22, 2021

(65) Prior Publication Data
US 2024/0099141 A1 Mar. 21, 2024

(30) Foreign Application Priority Data
Oct. 16, 2019 (JP) .................................. 2019-189373

(51) Int. Cl.
*H10N 10/82* (2023.01)
*H10N 10/17* (2023.01)
(52) U.S. Cl.
CPC ............. *H10N 10/82* (2023.02); *H10N 10/17* (2023.02)

(58) Field of Classification Search
CPC ...................................................... H10N 10/82
See application file for complete search history.

(56) References Cited

U.S. PATENT DOCUMENTS

2016/0163951 A1    6/2016  Tanaka et al.

FOREIGN PATENT DOCUMENTS

| JP | 2003-008084 A | 1/2003 |
| JP | 2004-281930 A | 10/2004 |

(Continued)

OTHER PUBLICATIONS

Koichi Tanaka, JP-2005050862-A, English Machine Translation. (Year: 2005).*

(Continued)

*Primary Examiner* — Tae-Sik Kang
(74) *Attorney, Agent, or Firm* — Troutman Pepper Locke LLP; James E. Armstrong, IV; Nicholas J. DiCeglie, Jr.

(57) ABSTRACT

A thermoelectric module includes: a lower substrate; an upper substrate that is disposed above the lower substrate and faces the lower substrate; a plurality of p-type and n-type thermoelectric elements that are disposed between the lower substrate and the upper substrate; a first electrode that is disposed on an upper surface of the lower substrate and a lower surface of the upper substrate and forms a series circuit by alternately and sequentially connecting the p-type and n-type thermoelectric elements; and a second electrode that is provided on the lower substrate and connects a thermoelectric element at an end portion of the series circuit and a post. The post includes a post main body that is formed of titanium, and a titanium passive film that covers a side surface of the post main body.

3 Claims, 4 Drawing Sheets

(56) References Cited

FOREIGN PATENT DOCUMENTS

| | | | |
|---|---|---|---|
| JP | 2005050862 A | * | 2/2005 |
| JP | 2016-111326 A | | 6/2016 |
| KR | 10-2018-0128186 A | | 12/2018 |

OTHER PUBLICATIONS

Ronald W. Schutz, "Corrosion of Titanium and Titanium Alloys", ASM Handbook, vol. 13B: Corrosion: Materials S.D. Cramer, B.S. Covino, Jr., editors, p252-299. (Year: 2005).*

* cited by examiner

THERMOELECTRIC MODULE AND METHOD FOR MANUFACTURING THERMOELECTRIC MODULE POST

TECHNICAL FIELD

The present invention relates to a thermoelectric module and a method of manufacturing a thermoelectric module post.

Priority is claimed on Japanese Patent Application No. 2019-189373, filed Oct. 16, 2019, the content of which is incorporated herein by reference.

BACKGROUND ART

Thermoelectric modules have been widely used as circuit elements that absorb or generate heat by the Peltier effect. As an example, as described in Patent Document 1 below, a thermoelectric module includes p-type and n-type thermoelectric elements, a pair of electrodes connecting these thermoelectric elements, posts for supplying current to the electrodes, and a housing covering these thermoelectric elements, electrodes, and posts from the outside. The p-type thermoelectric elements and the n-type thermoelectric elements are alternately connected in series, and columnar posts made of nickel are provided at both ends of the series circuit. A current is supplied with one post as a positive electrode and the other post as a negative electrode. As a result, the Peltier effect appears in the thermoelectric element, heat absorption occurs in one electrode, and heat generation occurs in the other electrode.

Here, in a case where the controlled temperature of the thermoelectric element is lower than a dew point of the surrounding environmental atmosphere, there is a possibility that dew condensation occurs in the thermoelectric module. When dew condensation occurs, a phenomenon called electrochemical migration is induced in the posts. Electrochemical migration is a phenomenon in which insulation between electrodes on an electric circuit becomes poor due to electrical, chemical, thermal, or other factors, and electrode metal is eluted and reduced as ions, causing a short circuit. In order to avoid this electrochemical migration, a configuration in which the housing is sealed from the outside and the inside of the housing is filled with an inert gas is conceivable.

PRIOR ART DOCUMENT

[Patent Document]
Patent Document 1: Japanese Unexamined Patent Application, First Publication No. 2016-111326

SUMMARY OF THE INVENTION

Problems to be Solved by the Invention

However, in the case where the housing is sealed and filled with the inert gas as described above, the manufacturing cost and man-hours increase, which is not economical. Therefore, there is an increasing demand for a thermoelectric module that can further suppress electrochemical migration with a simple configuration.

The present invention is made in order to solve the problem described above, and an object thereof is to provide a thermoelectric module capable of further suppressing electrochemical migration with a simple configuration, and a method of manufacturing a thermoelectric module post.

Means for Solving the Problem

In order to solve the above problem, a thermoelectric module according to the present invention includes: a lower substrate; an upper substrate that is disposed above the lower substrate and faces the lower substrate; a plurality of p-type and n-type thermoelectric elements that are disposed between the lower substrate and the upper substrate; a first electrode that is disposed on an upper surface of the lower substrate and a lower surface of the upper substrate and forms a series circuit by alternately and sequentially connecting the p-type and n-type thermoelectric elements; and a second electrode that is provided on the lower substrate and connects a thermoelectric element at an end portion of the series circuit and a post. The post includes a post main body that is formed of titanium, and a titanium passive film that covers a side surface of the post main body.

Effects of the Invention

According to present invention, it is possible to provide a thermoelectric module capable of further suppressing electrochemical migration with a simple configuration, and a method for manufacturing a thermoelectric module post.

DETAILED DESCRIPTION OF THE INVENTION

<Configuration of Optical Module>

Figure 1:
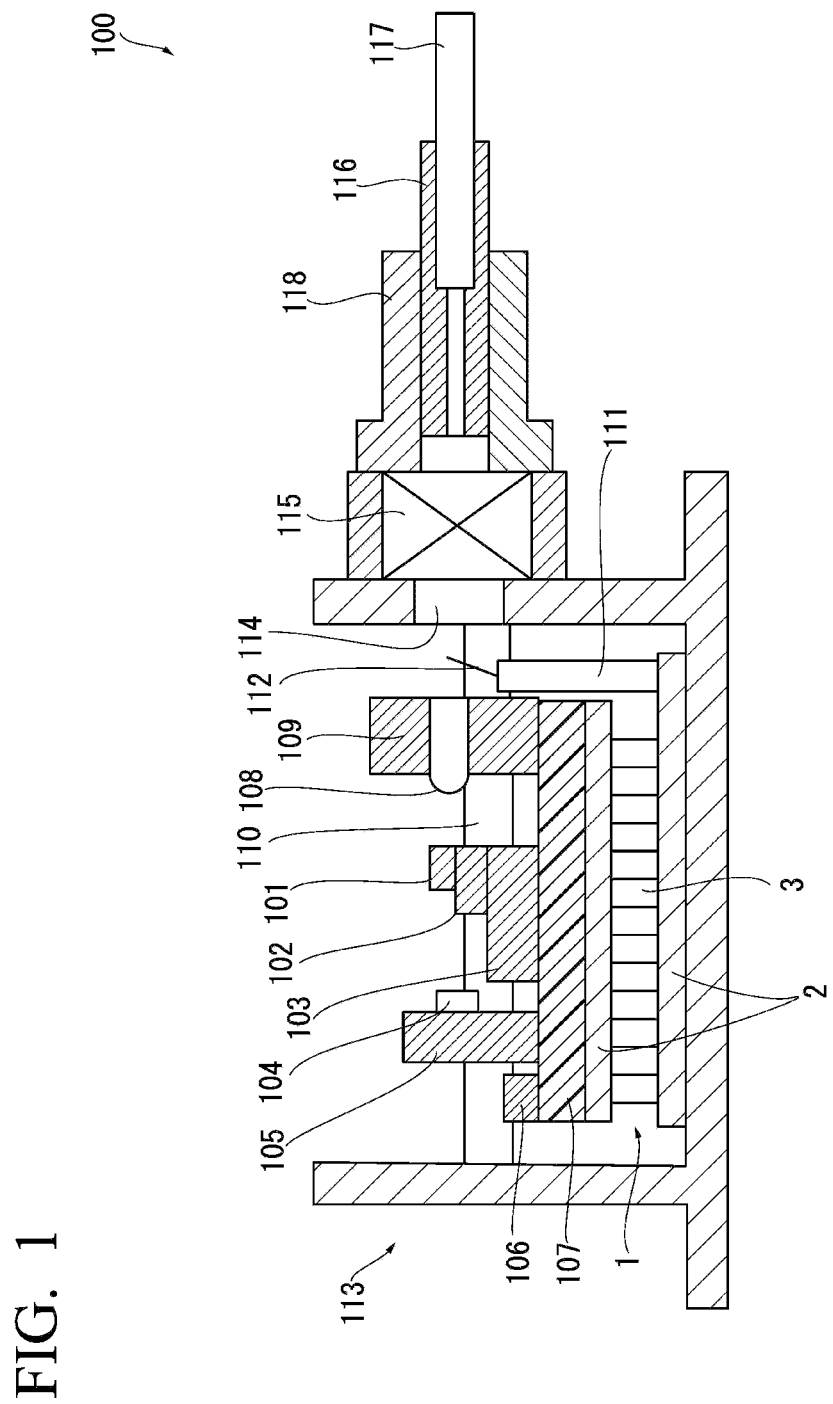
FIG. 1 is a cross-sectional view illustrating a configuration of an optical module according to an embodiment of the present invention.

Hereinafter, an optical module 100 and a thermoelectric module 1 according to an embodiment of the present invention will be described with reference to FIGS. 1 to 7. The optical module 100 is used for, for example, optical communication. As shown in FIG. 1, the optical module 100 includes a thermoelectric module 1, a light-emitting element 101, a heat sink 102, a first header 103, a light-receiving element 104, a second header 105, a temperature sensor 106, a metal plate 107, a lens 108, a lens holder 109, a wire 112, and a housing 113.

Further, the optical module 100 includes an optical isolator 115, an optical ferrule 116, an optical fiber 117, and a sleeve 118.

The thermoelectric module 1 is a circuit element that absorbs or generates heat by the Peltier effect. The detailed configuration of the thermoelectric module 1 will be described later.

The light-emitting element 101 emits light. The light-emitting element 101 includes, for example, a laser diode that emits laser light. The heat sink 102 supports the light-emitting element 101. The heat sink 102 dissipates heat generated by the light-emitting element 101. The first header 103 supports the heat sink 102. The heat sink 102 is fixed to the first header 103.

The light-receiving element 104 detects light generated from the light-emitting element 101. The light-receiving element 104 includes, for example, a photodiode. The second header 105 supports the light-receiving element 104. The light-receiving element 104 is fixed to the second header 105.

The temperature sensor 106 detects the temperature of the metal plate 107. The temperature sensor 106 includes, for example, a thermistor.

The metal plate 107 supports the first header 103, the second header 105, and the temperature sensor 106. The first header 103, the second header 105, and the temperature sensor 106 are fixed to the metal plate 107 by soldering.

The lens 108 collects light emitted from the light-emitting element 101. The lens holder 109 supports the lens 108.

The housing 113 accommodates the thermoelectric module 1, the light-emitting element 101, the heat sink 102, the first header 103, the light-receiving element 104, the second header 105, the temperature sensor 106, the metal plate 107, the lens 108, and the lens holder 109. An opening 114 through which light emitted from the light-emitting element 101 passes is formed in the housing 113.

The optical isolator 115 is disposed outside the housing 113 so as to close the opening 114. The optical isolator 115 transmits light traveling in one direction and blocks light traveling in the opposite direction. Light emitted from the light-emitting element 101 and passing through the lens 108 enters the optical isolator 115 through the opening 114. The light incident on the optical isolator 115 passes through the optical isolator 115.

The optical ferrule 116 guides the light emitted from the optical isolator 115 to the optical fiber 117. The sleeve 118 supports the optical ferrule 116.

Next, the operation of the optical module 100 will be described. Light emitted from the light-emitting element 101 is collected by the lens 108, and then enters the optical isolator 115 through the opening 114. The light incident on the optical isolator 115 passes through the optical isolator 115, and then enters an end face of the optical fiber 117 via the optical ferrule 116.

Heat generated from the light-emitting element 101 is transferred to the metal plate 107 through the heat sink 102 and the first header 103. The temperature sensor 106 detects the temperature of the metal plate 107. When the temperature sensor 106 detects that the temperature of the metal plate 107 reaches a predetermined specified temperature, a current is supplied to the thermoelectric module 1. When the thermoelectric element 3 of the thermoelectric module 1 is energized, the thermoelectric module 1 absorbs heat by the Peltier effect. As a result, the light-emitting element 101 is cooled. The temperature of the light-emitting element 101 is controlled by the thermoelectric module.

<Thermoelectric Module>

Figure 2:
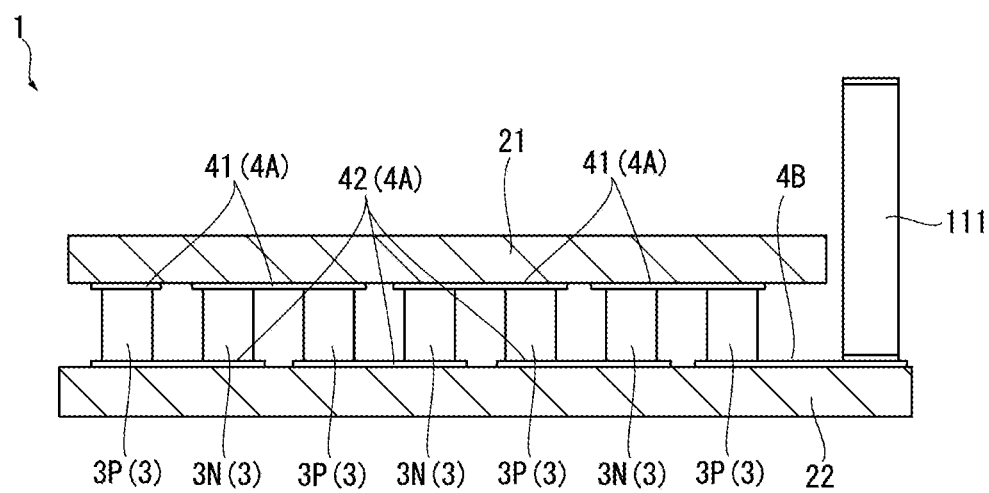
FIG. 2 is a cross-sectional view illustrating a configuration of a thermoelectric module according to the embodiment of the present invention.

As illustrated in FIG. 2, the thermoelectric module 1 includes a pair of substrates 2 (an upper substrate 21 and a lower substrate 22), a plurality of thermoelectric elements 3 (a p-type thermoelectric element 3P and an n-type thermoelectric element 3N) disposed between the substrates 2, a first electrode 4A (an upper electrode 41 and a lower electrode 42) connecting the thermoelectric elements 3, a post 111, and a second electrode 4B.

The upper substrate 21 and the lower substrate 22 have a plate shape and are made of an electrically insulating material. As an example, the upper substrate 21 and the lower substrate 22 are formed of ceramic. The upper substrate 21 faces the lower substrate 22 from above and is disposed at a distance from the lower substrate 22.

The plurality of thermoelectric elements 3 are arranged between the upper substrate 21 and the lower substrate 22 at intervals. That is, the thermoelectric elements 3 are disposed on the upper surface of the lower substrate 22 and the lower surface of the upper substrate 21 so as to face each other via electrodes 4 described later. The thermoelectric element 3 includes the p-type thermoelectric element 3P and the n-type thermoelectric element 3N according to the polarity of a semiconductor included in each thermoelectric element 3. In the present embodiment, these p-type thermoelectric elements 3P and n-type thermoelectric elements 3N are arranged so as to alternate in a cross-sectional view.

As shown in FIG. 2, the upper electrode 41 is provided on upper end surfaces of the p-type thermoelectric element 3P and the n-type thermoelectric element 3N, and a lower electrode 42 is provided on lower end surfaces thereof. Both the upper electrode 41 and the lower electrode 42 are wiring members formed of metal foil or the like on the substrate 2. The p-type thermoelectric element 3P and the n-type thermoelectric element 3N adjacent to the p-type thermoelectric element 3P are connected to each other by the lower electrode 42. The n-type thermoelectric element 3N and the p-type thermoelectric element 3P adjacent to said n-type thermoelectric element 3N are connected to each other by the upper electrode 41. Thus, the p-type thermoelectric elements 3P and the n-type thermoelectric elements 3N are alternately and sequentially connected to form a series circuit.

The post 111 is erected on the upper surface of the lower substrate 22. The post 111 is electrically connected to the thermoelectric element 3 located at an end portion of the series circuit via the second electrode 4B provided on the upper surface of the lower substrate 22. The wire 112 for supplying a current from the outside is connected to an upper end surface of the post 111. That is, a current is supplied from the wire 112 to the thermoelectric element 3 via the post 111. Although only one post 111 is shown in FIG. 2, a total of two posts 111 are provided as a positive electrode and a negative electrode.

<Post>

Figure 3:
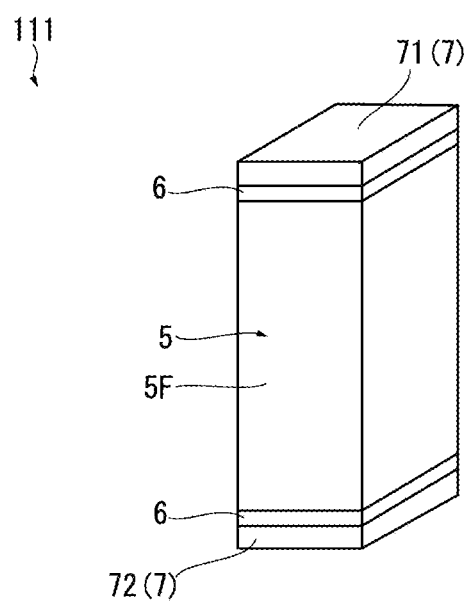
FIG. 3 is a perspective view illustrating a configuration of a post according to the embodiment of the present invention.

As shown in FIG. 3, the post 111 includes a post main body 5, an intermediate layer 6 provided on each of both end surfaces of the post main body 5 in the vertical direction, a plated portion 7 provided on an outer side of the intermediate layer 6, and a passive film 5F (titanium passive film) covering a side surface of the post main body 5.

The post main body 5 has a rectangular column shape integrally formed of titanium. When titanium is exposed to air, it is immediately denatured, and a passive film 5F is formed thereon. That is, in a state immediately after manufacturing, no processing or treatment is performed on the side surface of the post main body 5. The passive film 5F is an oxide film formed on a surface of titanium. Since the passive film 5F is not dissolved away even when exposed to solutions or acids, the internal titanium (post main body 5) is protected and the progress of oxidization is suppressed. In addition, the "side surface" of the post main body 5 refers to four surfaces other than a surface joined to the lower electrode 42 and an opposite surface of the joined surface.

The intermediate layer 6 is a metal film provided to improve adhesiveness of the plated portion 7. Specifically, at least one element selected from the group including gold, palladium, platinum, and rhodium is preferably used as the intermediate layer 6. It is also possible to adopt a configuration in which the plated portion 7 (described later) is directly provided on the post main body 5 without providing the intermediate layer 6.

The plated portion 7 includes an upper plated portion 71 (first plated portion) formed on a first surface which is a surface on an upper end side of the post main body 5, and a lower plated portion 72 (second plated portion) formed on a second surface which is a surface on the lower end side thereof. The upper plated portion 71 is a plating layer formed of gold. The lower plated portion 72 is a plating layer formed of an alloy of gold and tin. The intermediate layer 6 is provided in at least one of a location between the lower plated portion 72 and the post 111 or a location between the upper plated portion 71 and the post 111.

<Method for Manufacturing Post>

Figure 4:
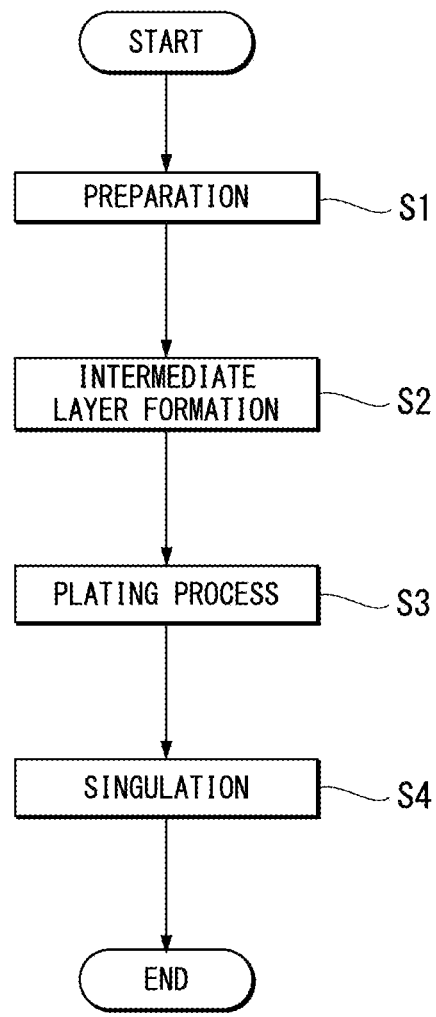
FIG. 4 is a flowchart illustrating steps of a method for manufacturing the post according to the embodiment of the present invention.

Next, a method for manufacturing the post 111 will be described with reference to FIGS. 4 to 6. As shown in FIG. 4, the manufacturing method includes a preparation step S1, an intermediate layer formation step S2, a plating processing step S3, and a singulation step S4.

Figure 5:
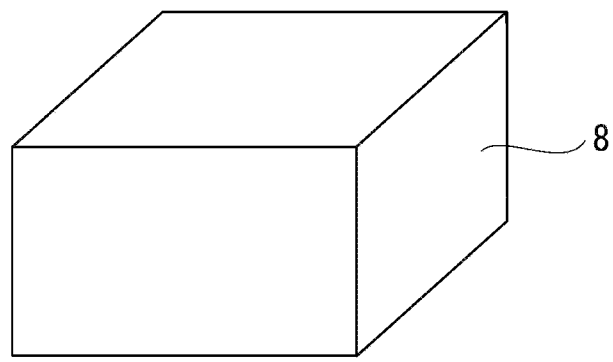
FIG. 5 is a perspective view illustrating a configuration of an element body in a preparation process in the method for manufacturing the post according to the embodiment of the present invention.
Figure 6:
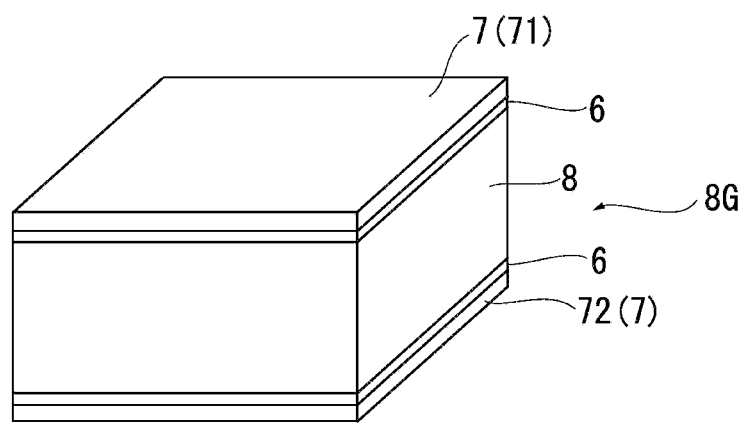
FIG. 6 is a perspective view illustrating a configuration of a plated element body after completion of a plating process step in a method for manufacturing the post according to the embodiment of the present invention.
Figure 7:
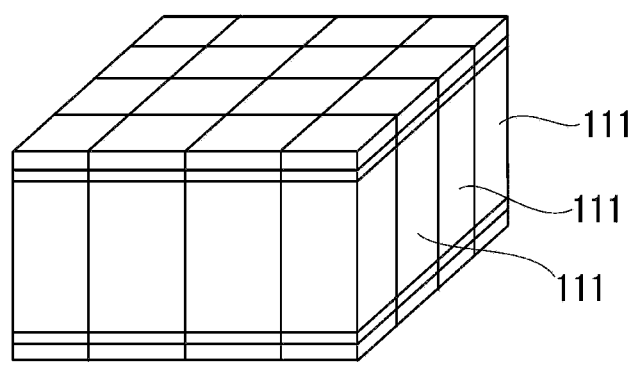
FIG. 7 is a perspective view illustrating a state after a singulation step is completed in the method for manufacturing the post according to the embodiment of the present invention.

In the preparation step S1, a plate member (element body 8) formed of titanium is prepared (FIG. 5). The element body 8 has a pair of end surfaces facing in directions away from each other in a thickness direction. More specifically, when the element body 8 extends in an XY plane, the thickness direction is a Z-axis direction in an XYZ coordinate system. In the intermediate layer formation step S2, the above-described intermediate layer 6 is formed on a surface (upper surface) on one side in the thickness-direction of the element body 8 and a surface (lower surface) on the other side. In addition, it is also possible to perform the subsequent plating processing step S2 without performing the intermediate layer formation step S3. In the plating processing step S3, the plated portion 7 described above is formed further outside the intermediate layer 6. Specifically, an upper plated portion 71 made of gold is formed on the upper surface side, and a lower plated portion 72 made of an alloy of gold and tin is formed on the lower surface side. The plated element body 8G is obtained accordingly. Thereafter, a singulation process is performed on the plated element body 8G. By the singulation process, the plated element body 8G is cut (singulated) in a lattice shape from the thickness direction. As a result, a plurality of posts 111 is obtained (FIG. 7). As described above, all the processes related to the manufacturing of the post 111 are completed.

<Effects>

Here, for example, a case where the post 111 is formed of nickel as an example is considered. In this case, if the temperature controlled by the thermoelectric element 3 falls below the dew point of the surrounding environmental atmosphere, there is a possibility that dew condensation occurs in the thermoelectric module 1. When dew condensation occurs, a phenomenon called electrochemical migration is induced in the post 111. Electrochemical migration is a phenomenon in which insulation between electrodes on an electric circuit becomes poor due to electrical, chemical, thermal, or other factors, and electrode metal is eluted and reduced as ions, causing a short circuit. When such a phenomenon occurs, a stable operation of the thermoelectric module 1 may be hindered. In order to avoid this electrochemical migration, a configuration in which the housing is sealed from the outside and the inside of the housing is filled with an inert gas is considered as an example.

However, in the case where the housing is sealed and filled with an inert gas, the manufacturing cost and man-hours increase, which is not economical. Therefore, there has been an increasing demand for a thermoelectric module that can further suppress electrochemical migration with a simple configuration.

Therefore, in the present embodiment, the post 111 is formed of titanium. By forming the post main body 5 of titanium, a passive film 5F is naturally formed on its side surface. The formation of the passive film 5F can prevent denaturation and deterioration due to moisture even if dew condensation occurs as described above. Further, even when a scratch is generated on the passive film 5F and titanium is exposed, a new passive film 5F is formed so as to immediately cover the scratch. As a result, the environmental resistance of the post 111 can be improved.

Further, in the above-described configuration, the upper plated portion 71 made of gold is formed on the upper end surface of the post main body 5, and the lower plated portion 72 made of an alloy of gold and tin is formed on the lower end surface thereof. Accordingly, it is possible to improve adhesiveness when the wire 112 is connected (bonded) to the upper plated portion 71. Further, it is possible to improve adhesiveness of the lower plated portion 72 into the lower electrode 42 by soldering.

Further, an intermediate layer 6 is provided between the upper plated portion 71 and the post main body 5 and between the lower plated portion 72 and the post main body 5. As a result, it is possible to further reduce the possibility that the upper plated portion 71 and the lower plated portion 72 peel off or fall off.

In addition, according to the above-described manufacturing method, after the intermediate layer 6 and the plated portion 7 are formed on both surfaces of the element body 8 in the thickness direction, the plated element body 8G is performed by singulation, so that a large number of posts 111 can be efficiently manufactured in a short time. As a result, man-hours and cost can be reduced.

Although the embodiments of the present invention have been described in detail with reference to the drawings, specific configurations are not limited to the embodiments, and design changes and the like within a scope not departing from the gist of the present invention are also included. For example, in the above-described embodiment, the thermoelectric module 1 is used as one element of the optical module 100. However, the thermoelectric module 1 may be applied to other mechanical devices different from the optical module 100.

INDUSTRIAL APPLICABILITY

According to the above disclosure, it is possible to provide a thermoelectric module capable of further suppressing electrochemical migration with a simple configuration, and a method for manufacturing a thermoelectric module post.

BRIEF DESCRIPTION OF THE REFERENCE SYMBOLS

100: Optical Module
1: Thermoelectric Module
2: Substrate
21: Upper Substrate
22: Lower Substrate
3: Thermoelectric Element
3P: p-type Thermoelectric Element
3N: n-type Thermoelectric Element
4: Electrode
4A: First Electrode
4B: Second Electrode
41: Upper Electrode
42: Lower Electrode
5: Post Main Body
5F: Passive Film
6: Intermediate Layer
7: Plated Portion
71: Upper Plated Portion (First Plated Portion)
72: Lower Plated Portion (Second Plated Portion)
8: Element Body
8G: Plated Element Body
101: Light-emitting Element
102: Heat Sink
103: First Header
104: Light-receiving Element
105: Second Header
106: Temperature Sensor
107: Metal Plate
108: Lens
109: Lens Holder
111: Post
112: Wire
113: Housing
114: Opening
115: Optical Isolator
116: Optical Ferrule
117: Optical Fiber
118: Sleeve

The invention claimed is:

1. A thermoelectric module comprising:
a lower substrate;
an upper substrate that is disposed above the lower substrate and faces the lower substrate;
a plurality of p-type and n-type thermoelectric elements that are disposed between the lower substrate and the upper substrate;
a first electrode that is disposed on an upper surface of the lower substrate and a lower surface of the upper substrate and forms a series circuit by alternately and sequentially connecting the p-type and n-type thermoelectric elements; and
a second electrode that is provided on the lower substrate and connects a thermoelectric element at an end portion of the series circuit and a post;
wherein the post includes:
a post main body that is formed of titanium;
a titanium passive film that is an oxide film formed to cover a side surface of the post main body;
a first plated portion provided on a first surface of the post connected to the second electrode and formed of an alloy of gold and tin; and
a second plated portion provided on a second surface of the post and formed of gold, the second surface being opposite to the first surface of the post.

2. The thermoelectric module according to claim 1, wherein the post includes an intermediate layer provided in at least one of a location between the second plated portion and the post or a location between the first plated portion and the post.

3. The thermoelectric module according to claim 2, wherein the intermediate layer is formed of at least one element selected from the group consisting of gold, palladium, platinum, and rhodium.

* * * * *